US008600068B2

(12) United States Patent
DeBoer et al.

(10) Patent No.: US 8,600,068 B2

(45) Date of Patent: Dec. 3, 2013

(54) SYSTEMS AND METHODS FOR INDUCING EFFECTS IN A SIGNAL

(75) Inventors: Scott M. DeBoer, Everett, WA (US); Kenneth O. Stanley, Orlando, FL (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 1806 days.

(21) Appl. No.: 11/742,317

(22) Filed: Apr. 30, 2007

(65) Prior Publication Data

US 2008/0267419 A1 Oct. 30, 2008

(51) Int. Cl.
*H03G 3/00* (2006.01)

(52) U.S. Cl.
USPC ................................ 381/61; 381/118; 381/62

(58) Field of Classification Search
USPC ........... 381/61, 62, 119, 118; 84/662; 706/15, 706/22; 700/94; 704/202
See application file for complete search history.

(56) References Cited

U.S. PATENT DOCUMENTS

| | | | | |
|---|---|---|---|---|
| 5,604,812 | A * | 2/1997 | Meyer | 381/314 |
| 6,664,460 | B1 * | 12/2003 | Pennock et al. | 84/662 |
| 7,678,985 | B2 * | 3/2010 | Adams et al. | 84/645 |
| 7,964,783 | B2 | 6/2011 | Rosario et al. | |
| 2006/0147050 | A1 * | 7/2006 | Geisler | 381/61 |

OTHER PUBLICATIONS

Kenneth O. Stanley and Risto Mikkulainen, "Evolving Neural Networks Through Augmenting Topologies," The MIT Press Journals, vol. 10, No. 2, pp. 99-127, 2002.

Kenneth O. Stanley, "Compositional Pattern Producing Networks: A Novel Abstraction of Development," Appeared in Genetic Programming and Evolvable Machines, Special Issue on Developmental Systems, New York, NY; Springer, 2007, pp. 1-36.

Kenneth O. Stanley, "Exploiting Regularity Without Development," Appeared in Proceedings of the 2006 AAAI Fall Symposium on Developmental Systems, Menio Park CA: AAAI Press, 2006, pp. 1-8.

* cited by examiner

*Primary Examiner* — Xu Mei

(74) *Attorney, Agent, or Firm* — Thomas | Horstemeyer, LLP

(57) ABSTRACT

A system for inducing an effect in a raw audio signal comprises a computing device for receiving a first audio signal and a second audio signal from a signal source, and the second audio signal comprises the first audio signal induced with an effect. The system further comprises logic that parameterizes the effect in the second audio signal into an artificial neural network (ANN).

18 Claims, 7 Drawing Sheets

SYSTEMS AND METHODS FOR INDUCING EFFECTS IN A SIGNAL

BACKGROUND

An electric guitar produces a raw audio signal when a musician strums strings on the guitar. Oftentimes, the musician induces a "guitar effect" in the raw audio signal via hardware or software in order to modify the way the raw audio signal is heard by a listener. Exemplary types of guitar effects that can be induced in the raw audio signal include zoom, crunch amp, distortion, fuzz, overdrive, chorus, reverberation, wah-wah, flanging, phaser, and/or pitch shifting.

Oftentimes, the electric guitar is electrically connected to hardware, typically referred to as an "effects pedal." In turn, the effects pedal is electrically connected to an amplifier. The effects pedal is usually a box that is comprised of an electronic circuit, and the box sits on the floor. The musician actuates the effects pedal by depressing a pushbutton located on the box. Thus, when the musician plays the guitar and actuates the effects pedal, the effects pedal modifies the sound quality or timbre exhibited by the raw audio signal from the guitar before the signal is transmitted to an amplifier.

Additionally, guitar effects may be induced in the raw audio signal by software. In this regard, the raw audio signal is recorded, for example in a studio. The raw audio Additionally, guitar effects may be induced in the raw audio signal by software. In this regard, the raw audio signal is recorded, for example in a studio. The raw audio signal is then modified via a software package in order to induce a desired effect in the raw audio signal.

Notably, however, guitar effects pedals are expensive and each effects pedal is limited to a particular effect or a limited number of effects. Thus, in order to induce different effects in the raw audio signal more than one effects pedal may be needed. Furthermore, software packages that induce effects in recorded raw audio signals are expensive are oftentimes cumbersome to use.

SUMMARY

The present disclosure pertains to systems and methods for inducing effects in raw audio signals.

In one embodiment, a system for inducing an effect in a raw audio signal comprises a signal source for generating a first audio signal and a second audio signal, the second audio signal comprising the first audio signal induced with an effect. The system further comprises logic configured to parameterize the effect in the second audio signal into an artificial neural network (ANN) and logic configured to receive a raw audio signal from a second source and induce the parameterized effect in the raw audio signal via the ANN.

In another embodiment, a method for inducing an effect in a raw audio signal comprises parameterizing a particular effect in an artificial neural network. The method further comprises storing the generated neural network, loading the neural network, introducing a raw input signal to the neural network, and applying the effect, via the generated neural network, to the raw input signal.

BRIEF DESCRIPTION OF THE FIGURES

The components in the drawings are not necessarily to scale, emphasis instead being placed upon clearly illustrating the principles of the present disclosure. In the drawings, like reference numerals designate corresponding parts throughout the several views.

DETAILED DESCRIPTION

As described above, there are various limitations to using effects pedals and/or effects software to induce an effect into a raw audio signal, e.g., a signal received from an electric guitar. Disclosed herein, however, are systems and methods that can be used to induce effects in raw audio signals by parameterizing an effect in an artificial neural network (ANN) and inducing the parameterized effect into the raw audio signal via the ANN.

Although producing an effect in a raw audio signal generated by a guitar is described with specificity in this disclosure, it is to be appreciated that the disclosed systems and methods can be extended to produce an effect in a raw audio signal generated by other electronic devices. Furthermore, although particular embodiments of systems and methods are described in the following, those embodiments are mere example implementations of the systems and methods and it is noted that other embodiments are possible. All such embodiments are intended to be within the scope of this disclosure. The terminology used in this disclosure is selected to describe the disclosed systems and methods and is not intended to limit the breadth of the disclosure.

Figure 1:
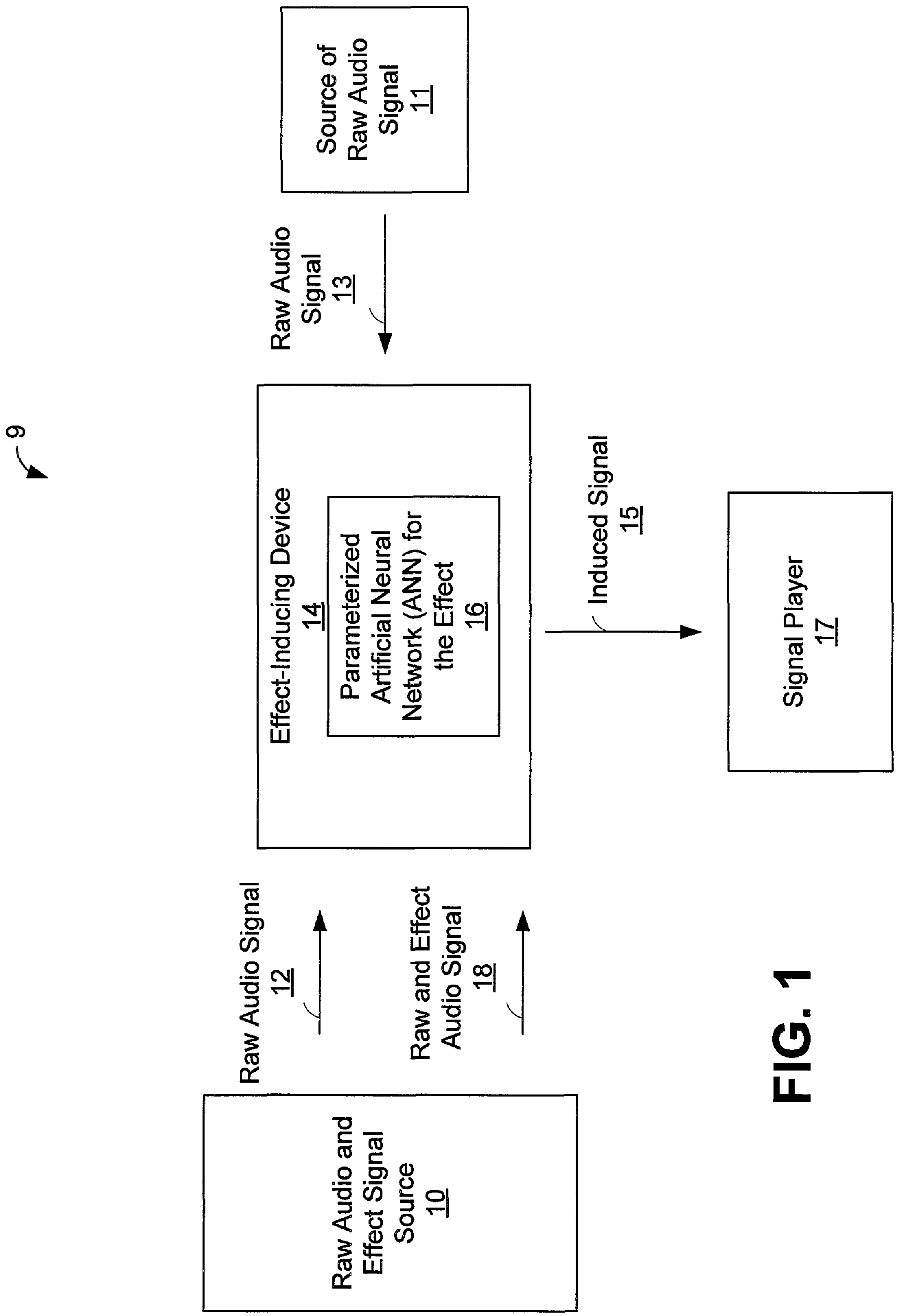
FIG. 1 is a block diagram depicting an embodiment of an effect-inducing system of the present disclosure.

FIG. 1 depicts an effect-inducing system 9 in accordance with an embodiment of the present disclosure. The effect-inducing system 9 comprises a raw and effect audio signal source 10, an effect-inducing device 14, and a raw audio signal source 11. The raw and effect audio signal source 10 generates a raw audio signal 12 and a raw audio and effect learning signal 18 and transmits the signals 12 and 18 to the effect-inducing device 14. Note that the raw and effect audio signal 18 comprises the raw audio signal 12 induced with a particular effect.

In one embodiment, the raw and effect audio signal source 10 is, for example, a guitar (not shown) and an effects pedal (not shown). In such an embodiment, the guitar transmits the raw audio signal 12 to the effect-inducing device 14. In addition, the raw audio signal 12 is processed through the effects pedal and the effects pedal transmits the raw and effect audio signal 18 to the effect-inducing device 14. As noted hereinabove, the raw and effect audio signal 18 comprises the raw audio signal 12 induced with a particular effect. Alternatively, the source 10 may comprise a plurality of audio files, which comprise a digital representation of a raw audio signal 12 and a digital representation of the raw audio signal 12 induced with a particular effect.

Upon receipt of the raw audio signal 12 and the raw and effect audio signal 18, the effect-inducing device 14 generates and stores an artificial neural network (ANN) 16 for inducing the effect in the raw and effect audio signal 18 in a raw audio signal 13. Creation of the ANN 16 is described further with reference to FIGS. 2 and 3.

During operation, the effect-inducing device 14 receives the raw audio signal 13 from a source 11 and introduces the signal 13 to the ANN 16. The ANN 16 processes the raw audio signal 13 and generates an induced signal 15 comprising the raw audio signal 13 induced with the effect parameterized in the ANN 16. In one embodiment, the effect-inducing device 14 transmits the induced signal 15 to a signal player 17, and the signal player 17 plays the audio signal so that a user can hear the raw audio and effect induced signal 15.

Thus, the effect-inducing system 9 evolves the ANN 16 that emulates the effect. The ANN 16 evolved can be used to modify other raw signals 13 by introducing the effect emulated in the raw signals 13 received.

Note that FIG. 1 depicts that the effect-inducing device 14 generates an ANN 16 associated with an effect present in the raw and effect audio signal 18. However, the effect-inducing device 14 may receive a plurality of raw audio signals 12 and associated raw and effect audio signals 18. Thus, the effect-inducing device 14 generates an ANN 16 for each particular effect in each raw and effect audio signal 18 received. However, for simplicity and brevity, FIGS. 1-4 are described with reference to a single raw audio signal 12 and associated raw and effect audio signal 18, as it is parameterized in ANN 16, and applying the effect parameterized in the ANN 16 to the raw audio signal 13.

In one embodiment, a user (not shown) may select one of a plurality of effects associated with a plurality of ANN's generated by the device 14 for inducement in the raw audio signal 13. In this regard, the effect-inducing device 14 may display to the user a listing of a plurality of ANN's, and the user may then select which ANN 16 to use to apply a desired effect to the raw audio signal 13. In this regard, a "desired" effect refers to an effect that a user desires to induce into a particular raw audio signal and which is parameterized in an ANN 16.

As indicated hereinabove, the source 11 produces the raw audio signal 13. An exemplary source 11 is a guitar, or other instrument, that is electrically connected to the effect-inducing device 14. Alternatively, the source 11 may comprise a computer, e.g., recording equipment, which can transmit a digitally captured pre-recorded raw audio signal 13 to the effect-inducing device 14. In each scenario, the effect-inducing device 14 induces in the raw audio signal 13 the effect parameterized in the ANN 16 from the raw and effect audio signal 18. Inducement of the effect parameterized in the raw output signal 13 is accomplished in two stages.

In the first stage, the effect-inducing device 14 generates the ANN 16 by evolving a network that will produce the raw and effect audio signal 18 as an output upon receiving as an input the raw audio signal 12. To generate the ANN 16, the effect-inducing device 14 receives the signals 12 and 18 from the source 10. As described hereinabove, the raw audio signal 12 is a raw audio signal that may be produced by a guitar or may be a digital representation of a raw audio signal from a guitar, for example. The raw and effect audio signal 18 is the raw audio signal 12 induced with a particular effect.

Upon receipt of the raw audio signal 12 and the raw and effect audio signal 18, the device 14 parameterized the effect in the signal 18 by generating the ANN 16, which induces the parameterized effect in another raw audio signal 13. In this regard, the device 14 applies a learning algorithm to the received signals 12 and 18, described further herein, and generates the ANN 16 capable of producing the particular effect in the raw audio signal 13.

In one embodiment, the effect-inducing device 14 applies Neuroevolution through Augmenting Topologies (hereinafter referred to as NEAT) to generate the ANN 16. Neuroevolution refers to a method for artificially evolving neural networks using genetic algorithms, and NEAT refers to a Neuroevolution method wherein the structure of the neural network being generated is incrementally grown such that the topologies of the ANN are minimized. Notably, NEAT is described in "Evolving Neural Networks through Augmenting Topologies," in The MIT Press Journals, Volume 10, Number 2 authored by K. O. Stanley and R. Mikkulainen, incorporated herein by reference. The NEAT learning algorithm and its application within the effect-inducing device 14 is described hereinafter with reference to FIGS. 2 and 3.

In stage two, the source 11 described hereinabove generates the raw audio signal 13 and transmits the signal 13 to the effect-inducing device 14. The effect-inducing device 14 introduces the raw audio signal 13 to the ANN 16, and the ANN 16 induces the learned effect in the signal 13 to create the induced audio signal 15. The effect-inducing device 14 transmits the signal 15 to the signal player 17, and the signal player 17 plays the signal 15 so that the signal 15 is audible to a user (not shown).

Figure 2:
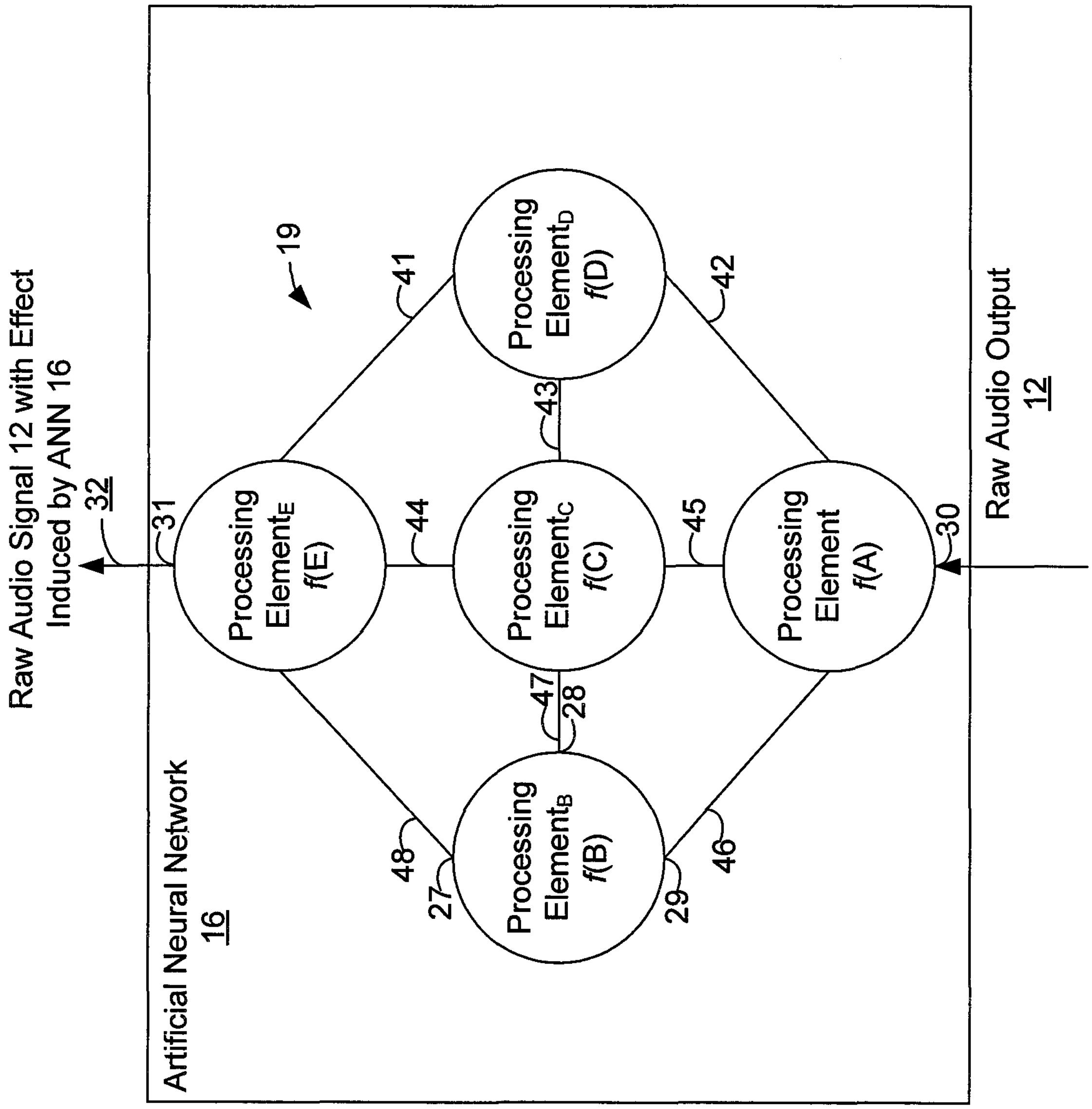
FIG. 2 is a diagram of an initial topology of an artificial neural network (ANN) for illustrating the generation of an artificial neural network (ANN) by the effect-inducing system depicted in FIG. 1.
Figure 3:
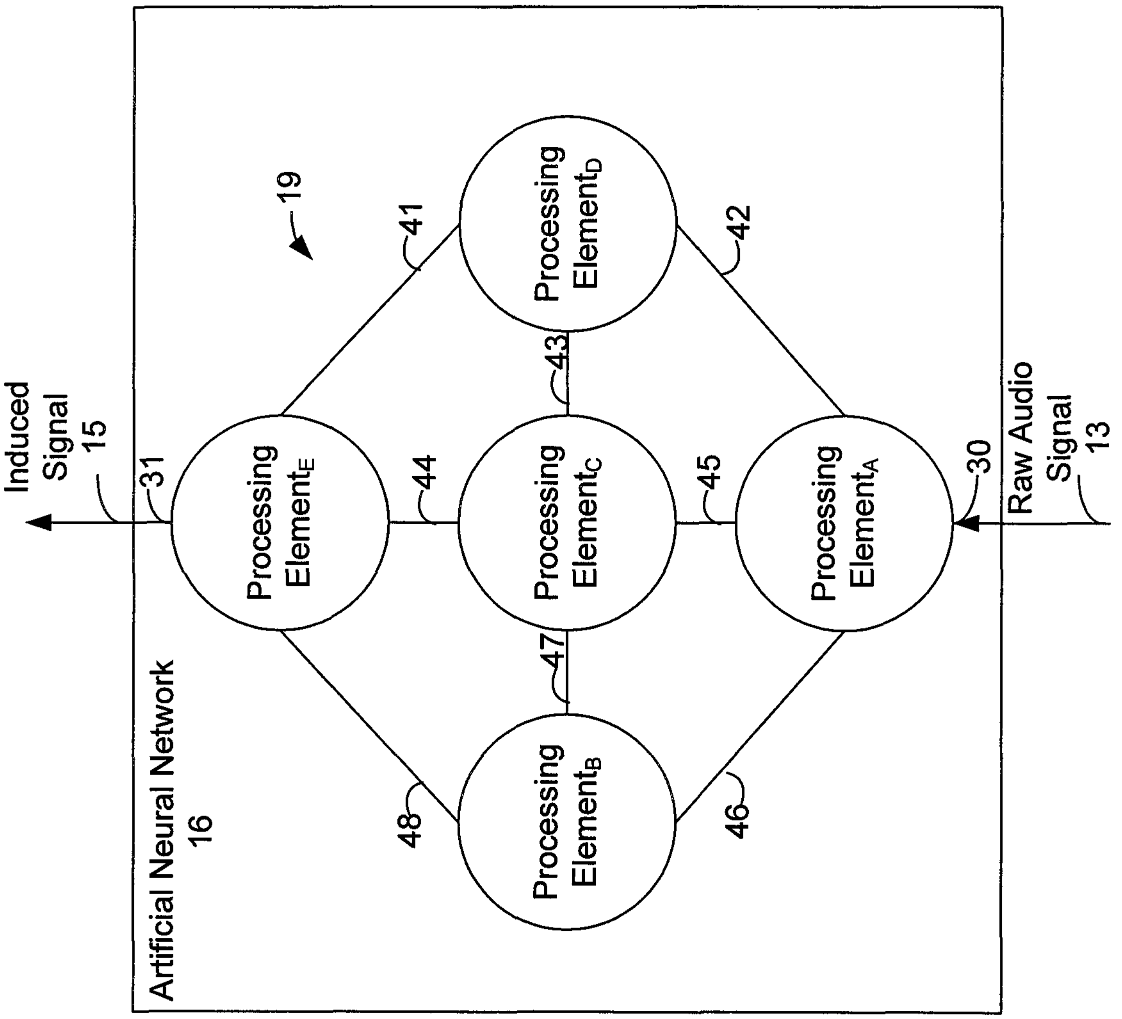
FIG. 3 is a diagram of a evolved topology of an ANN for illustrating the application of the ANN generated by the effect-inducing system depicted in FIG. 1 to a raw audio signal.

FIGS. 2 and 3 are now discussed to illustrate generation of the ANN 16 based upon the received signals 12 and 18 and employing a Neuroevolution method in stage one. FIG. 2 depicts exemplary topology 19 that may be evolved for a particular effect that is being parameterized by the effect-inducing device 14. Accordingly, FIG. 2 is now described to further illustrate stage one as described hereinabove.

FIG. 2 depicts the ANN 16 exhibiting a particular topology 19 having a plurality of processing elements A-E. The processing elements A-E are positioned with respect to each other as described further herein, and the processing elements A-E are connected through multiple connections 41-48. Furthermore, each of the processing elements A-E performs the function f(A)-f(E), respectively, on its received input(s). Each function is referred to as an "activation function," which is a mathematical formula that transforms an input(s) of a processing element A-E in an ANN into an output(s), as described further herein.

Note that the placement of the processing elements A-E, an activation function f(A)-f(E), described further herein, of each processing element A-E, and the strength of the connections 41-48 are referred to as the "topology" of the ANN 16. The strength of the connections 41-48 are manipulated, as described further herein, during evolution of the ANN 16 to produce an ANN 16 that more closely induces a desired effect in the raw audio signal. As described hereinabove, a "desired" effect is one that a user desires to induce in a raw audio signal and which is or can be parameterized in an ANN 16. Thus, the strengths of the connections 41-48 may be increased and/or decreased in order to manipulate the output of the ANN 16.

The ANN 16 further comprises at least one input 30 for receiving the raw audio signal 12 and an output 31 for transmitting the raw audio signal 12 exhibiting an effect induced by the ANN 16. Note that the ANN 16 shall be described with respect to parameterizing an effect and employing the ANN 16 to induce the parameterized effect in the raw audio signal 12 received via its input 31. The ANN 16 shall transmit a signal 32 that includes the raw audio signal 12 induced with the parameterized effect.

In one embodiment, the raw audio signal 12 is embodied, for example, in a ".wav" file. In this regard, a ".wav file" refers to an uncompressed digital representation of a sampled audio signal, hereinafter referred to as a "wav file." The wav file stores digital data that may include, for example, information indicative of the amount of digital data in the wav file, the rate at which the audio signal was sampled, and digital data representative of sampled audio signal. Notably, the digital data representative of the sampled audio signal comprises numerical values representative of the amplitude of the audio signal at a discrete point in time.

During operation, each of the processing elements A-E performs the function f(A)-f(E), respectively, on its received input(s). Each function is referred to as an "activation function," which is a mathematical formula that transforms an input(s) of a processing element A-E in an ANN into an output(s), as described further herein.

Exemplary activation functions include sigmoid, Gaussian, or additivie. Each of these functions is specifically described herein. Note that, unless otherwise specified, the variable x used in each exemplary function provided herein represents the sum of each input multiplied by the weight of the connection over which the input is received.

As an example, f(B) may employ a sigmoid activation function represented by the following mathematical formula:

$$f(B)=(2.0*(1.0/(1.0+\exp(-1.0*x))))-1.0 \qquad \text{A.1}$$

In such an example, the variable x is represented by the following formula:

$$x=\text{input 29*weight of connection 46+input 28*weight of connection 4}, \qquad \text{A.2}$$

as described hereinabove.

As another example, f(B) may employ a Gaussian activation function represented by the following mathematical formula:

$$f(B)=2.5000*((1.0/\text{sqrt}(2.0*PI))*\exp(-0.5*(x*x))) \qquad \text{A.3}$$

In such an example, the variable x is also represented by the formula A.2 described hereinabove.

As another example, f(B) may employ a different Gaussian activation function represented by the following mathematical formula:

$$f(B)=(5.0138*(1/\text{sqrt}(2*PI))*\exp(-0.5*(x*x)))-1 \qquad \text{A.4}$$

In such an example, the variable x is also represented by the formula A.2 described hereinabove.

Numerous activation functions may be employed in each of the plurality of processing elements A-E, including but not limited to an additive function, y=x; an absolute value function, y=|x|; and exponent function, y=exp(x); a negative function y=−1.0*(2*(1.0/(1.0+exp(−1.0*x)))−1); a reverse function, if (value>0) y=2.5000*((1.0/sqrt(2.0*PI))*exp(−8.0*(x*x))) else if (value<0) y=−2.5000*((1.0/sqrt(2.0*PI))*exp(−8.0*(x*x))); sine functions, y=sin((PI*x)/(2.0*4.0)), y=sin(x*PI), or y=sin(x*2*PI); an inverse Gaussian function y=−2.5000*((1.0/sqrt(2.0*PI))*exp(−0.5*(value*value))); a multiply function, wherein instead of adding the connection values, they are multiplied and a sigmoid, e.g, A.1 is applied to the final product.

As an example, processing element B comprises input 28, input 29, and output 27. Further, for exemplary purposes, the connection 46 may exhibit a connection strength of "2." Note that the "strength" of a connection affects the amplitude or the numeric value of the particular discrete value that is input into the processing element. The function f(B) employed by processing element may be, for example, a summation function, i.e., $$f(B)=\Sigma(\text{Inputs})=\text{input 28}+2*(\text{input 29})=\text{output 27}.$$

Note that other functions may be employed by the processing elements A-E, as described hereinabove, and the summation function used hereinabove is for exemplary purposes.

In one embodiment, the effect-inducing device 14 employs NEAT to evolve the topology 19 of the ANN 16, as indicated hereinabove. In employing NEAT to evolve a topology 19 of an ANN 16 capable of producing the desired effect, the effect-inducing device 14 first minimally and randomly generates a plurality of ANNs, hereinafter referred to as the "initial population." Note that while those ANNs generated are random, the NEAT algorithm, as identified hereinabove, begins with an initial population exhibiting a minimal number of structural elements, e.g., processing elements.

In one embodiment, the initial population may comprise, for example, ten ANNs having an input processing element and an output processing element. In such an example, each input processing element and output processing element of each ANN randomly generated employs one of a plurality of activation functions, as described hereinabove, in a different manner. For example, one of the randomly generated ANNs may employ formula A.1 in its input processing element and A.2 in its output processing element, whereas another randomly generated ANN in the initial population may employ A.2 in its input processing element and A.1 in its output processing element. In this regard, the ANNs generated for the initial population are diverse.

Further, the connection weight intermediate the input and output processing elements of each ANN in the initial population may vary as well. As an example, in one randomly generated ANN the connection weight between the input processing element and the output processing element may be 2, whereas in another randomly generated ANN the connection weight may be 3.

Once the effect-inducing device 14 generates the initial population, each of the randomly generated ANNs and hence, their corresponding topologies are tested for "fitness." Note that the "fitness" of an ANN refers to the ANN's ability to produce a desired output based upon an input. Therefore, with respect to inducing a desired effect in a raw audio signal, the effect-inducing device 14 tests each randomly generated ANN in the initial population to determine how closely the particular topology exhibited by each ANN induces the desired effect in the raw audio signal.

In one embodiment, as described hereinabove, the input provided to the ANN 16 is data retrieved from a wav file, which comprises digital data representative of a sampled audio signal. As an example, the digital data in the wav file may represent three seconds of an audio signal. The effect-inducing device 14 may select only a portion of the three seconds, e.g., one second, of the digital data to provide to the ANN for testing purposes. In this regard, the effect-inducing device 14, depending upon the rate at which the audio signal was sampled, provides a value for a discrete time in time, e.g., a value every 1 millisecond.

For each value provided over the one-second period, the effect-inducing device 14 stores the output 32 in a digital format compatible with the wav file input. Once each value over the one-second period is stored, the effect inducing device 14 compares those discrete values with the corresponding values in a wav file comprising digital data representative of the raw and effect audio signal 18 that embodies the raw audio signal 12 with the induced effect. Thus, in testing the fitness of each ANN produced in the initial population, the effect-inducing device 14 may employ the following formula:

$$\text{Fitness}=(\text{test}(i)-\text{target}(i))*(\text{test}(i)-\text{target}(i)) \qquad \text{B.1}$$

where test(i) represents the output of the ANN that is being tested for fitness at a particular time and target(i) represents the value corresponding to the particular time in the wav file representative of the raw and effect audio signal 18.

In one embodiment, the effect-inducing device 14 uses the calculated "Fitness" value to determine whether the particular topology employed by the tested ANN should be used in creating another generation of topologies in the evolution of an ANN capable of producing a desired effect. In this regard, the effect-inducing device 14 may compare the fitness value with a threshold value, and if it meets or exceeds such a value, the effect-inducing device 14 may phase out the particular topology exhibited by the ANN that is being tested. If not, however, the effect-inducing device 14 may generate a next generation of topologies based upon the initial population.

Based upon the fitness values of the ANNs of the initial population and the NEAT algorithm, the effect-inducing device 14 may evolve those topologies exhibited by the initial population by changing the topologies and weights of one or more of the ANNs tested. In this regard, the effect-inducing device 14 may mutate one or more of the topologies, e.g., add a connection between existing processing elements or add an additional processing element, of the initial population. In addition, topologies may mutate by changing of connection weights between the various processing elements in the ANN that is mutating.

In addition to mutating particular topologies to produce a topology that results in a topology exhibiting better fitness, the effect-inducing device 14 may also mate two separate topologies, hereinafter referred to as the "parent" topologies. In this regard, the effect-inducing device 14 may mate the parent topologies based upon one or more structural characteristics common to them. In such an example, the effect-inducing device 14 may produce one or more "offspring" topology that exhibit combinations of the structural characteristics of the parent topologies.

Note that the process as described may be performed for a number of generations. In this regard, when the fitness of a particular evolved topology produces an output that is substantially similar to the desired output, e.g., the raw and effect audio signal 18, then the ANN 16 is created.

Once an initial set of topologies is created, each of the topologies is tested for its fitness, as described hereinabove. In this regard, the effect-inducing device 14 processes the raw audio signal 12 through each topology 19 generated in the initial population. Note as described herein that the raw audio signal 12 does not exhibit the effect for which the effect-inducing device 14 is parameterizing. The raw audio signal 12 is provided as input 30 to each topology 19 of each ANN 16 in the initial set a portion at a time. Thus, for each time demarcation, $t_0$-$t_x$, each ANN 16 transmits as output 31 a signal 32 exhibiting an effect induced by its corresponding topology 19.

In determining the fitness of a particular topology exhibited by an ANN, the effect-inducing device 14 compares the signal 32 at each time demarcation, $t_0$-$t_x$, with that corresponding portion of the raw and effect signal 18 corresponding to the signal 32. The effect-inducing device 14 associates with each compared signal a value indicative of how similar the output signal 32 is to the raw and effect signal 18 at the particular time.

If the ANN's fitness indicates that the ANN 16 is substantially likely to produce the effect embodied in the raw and effect signal 18 with some changes to the topology 19 of the ANN 16, the effect-inducing device 14 generates "children" of the ANN 16 and repeats the process described hereinabove for scoring the child. Note that a "child" of the ANN 16 refers to an ANN 16 that exhibits a topology closely related to the topology 19 of the ANN 16

The effect-inducing device 14 continues the process of mutating topologies and generating children topologies from parent ANNs until at least one of the children ANNs produces a signal that is substantially similar to the raw and effect audio signal 18. Thus, the effect found in the raw and effect audio signal 18 is parameterized within the ANN itself through an implicit process of natural selection.

The process described hereinabove is an exemplary process for generating the ANN 16. Other processes for parameterizing an effect in a generated neural network may be used in other embodiments.

As described hereinabove, the effect-inducing device 14 receives the raw audio signal 12 and the raw and effect audio signal 18. During evolution, via Neuroevolution methods, the effect-inducing device 14 determines the number of processing elements A-E, their position with respect to one another, and the strength of their connections 41-48 to one another such that when the raw audio signal 12 is introduced to the evolved ANN 16, the ANN 16 processes the raw audio signal 12 such that it transmits the raw and effect audio signal 18. In this regard, the effect-inducing device 14 parameterizes the effect in the ANN 16 so that a signal that runs through the ANN 16 is induced with the parameterized effect. Once the device 14 generates a topology 19 that produces the raw and effect audio signal 18 when the signal 12 is presented, the effect-inducing device 14 has "learned" the effect present in the raw and effect audio signal 18.

Note that through the evolution of the topology 19, when employing NEAT, the effect-inducing device 14 begins the process with a minimum number of processing elements A-E and evolves the ANN 16 until the number processing elements A-E and the strength of their connections 41-48 are determined. Thus, the topology 19 represented by processing elements A-E is for exemplary purposes, and the number of processing elements A-E for each effect learned and their corresponding connection strengths vary. As indicated hereinabove, each topology 19 for each effect learned by the effect-inducing device 14 will differ based upon the particular effect for which the topology 19 is evolved.

FIG. 3 depicts operation of the ANN 16 at stage two after the effect-inducing device 14, as described hereinabove, generates the ANN 16 capable of producing a desired effect in a raw audio signal 12. The source 11 generates the raw audio signal 13 and introduces the signal 13 to the effect-inducing device 14. The device 14 presents the signal 13 to the input 30 of the ANN 16, and the ANN 16 processes the signal 13, which induces the effect in the signal 13.

As noted hereinabove, the source 11 of the raw audio signal 13 may be a guitar electrically connected to the effects inducing system 14. Alternatively, the source 11 of the raw audio signal 13 may be a pre-recorded digital representation of a raw audio signal from recording equipment (not shown).

In processing the raw audio signal 13, the ANN 16 processes the raw audio signal 13 through each of the processing elements A-E. In this regard, the signal 13 is transmitted through each of the processing elements A-E, which performs its respective function on their respective inputs. Thus, each function, as described hereinabove, is applied to signal 13 in order to induce the desired effect in the raw audio signal 13. After processing the signal 13 through each of the processing elements A-E, the ANN 16 transmits the induced signal 15, which comprises the raw audio signal 13 induced with the desired effect parameterized in the ANN 16 as described hereinabove. In one embodiment, the induced signal 15 is transmitted to a signal player 17, and the signal player 17 plays the induced signal 15 such that it is audible by a user.

Figure 4:
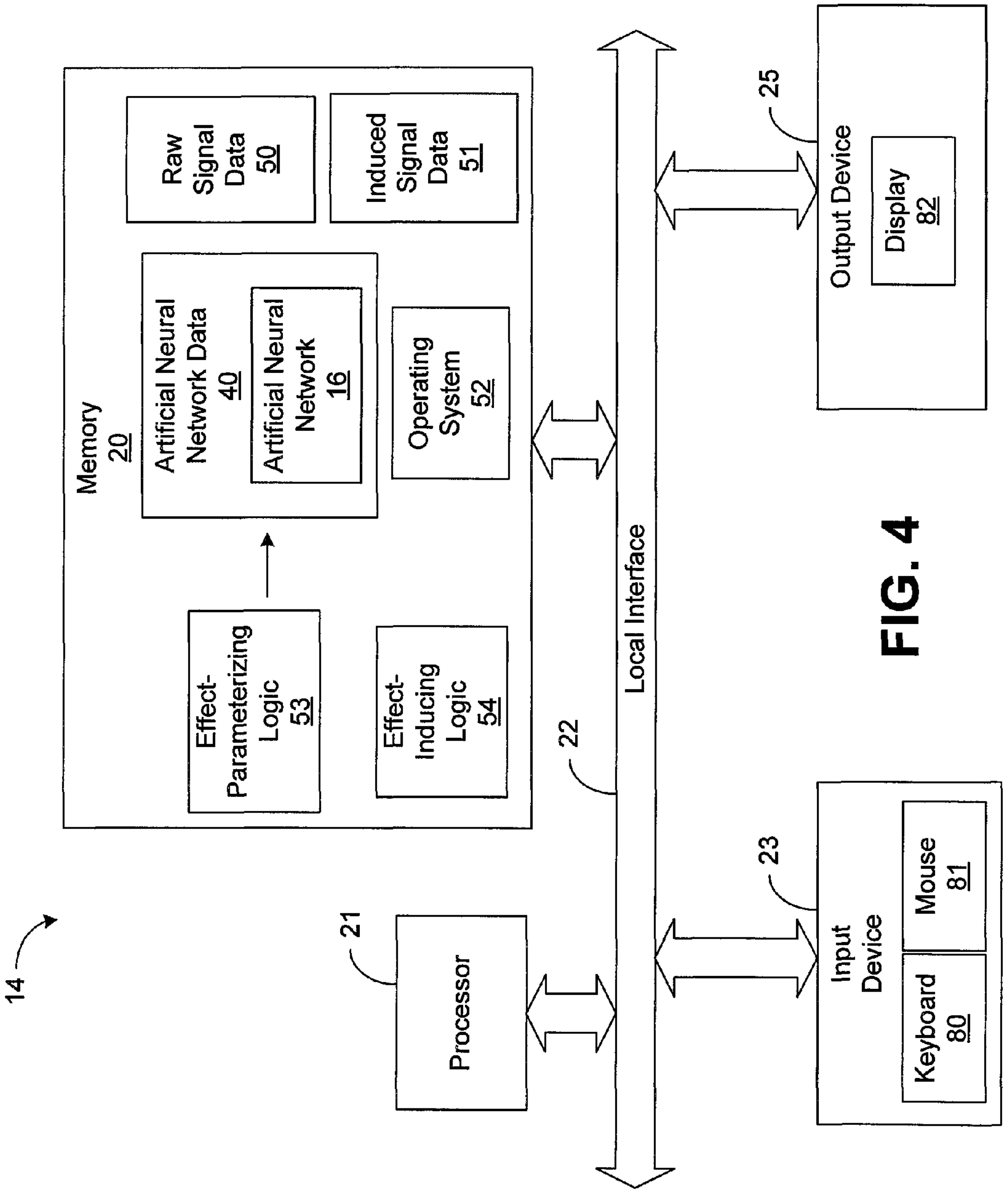
FIG. 4 is block diagram of an effect-inducing device as is depicted in FIG. 1.

FIG. 4 illustrates an exemplary architecture for the effect-inducing device 14 shown in FIG. 1. As indicated in FIG. 4, the effect-inducing device 14 generally comprises a processor 21, memory 20, and one or more input/output (I/O) devices 23 and 25, respectively, each of which is connected to a local interface 22.

The processor 18 can include any commercially-available or custom-made processor, a central processing unit (CPU), an auxiliary processor among several processors associated with the effect-inducing system 14, or a semiconductor-based microprocessor (in the form of a microchip). The memory 20 can include any one or a combination of volatile memory elements (e.g., random access memory (RAM)) and nonvolatile memory elements (e.g., hard disk, compact disc (CD), flash memory, etc.).

The I/O devices 23 and 25 comprise those components with which a user can interact with the effect-inducing system 14, such as a display 82, keyboard 80, and a mouse 81, as well as the components that are used to facilitate connection of the computing device to other devices (e.g., serial, parallel, small computer system interface (SCSI), or universal serial bus (USB) connection ports).

Memory 20 stores various programs, in software and/or firmware, including an operating system (O/S) 52, effect-parameterizing logic 53, and effect-inducing logic 54. The O/S 52 controls execution of other programs and provides scheduling, input-output control, file and data management, memory management, and communication control and related services. In addition, memory 20 stores artificial neural network (ANN) data 40 comprising at least one ANN 16 parameterizing an effect, raw audio signal data 50, and induced signal data 51.

During operation, the effect-parameterizing logic 53 receives, from source 10 (FIG. 1) via the input device 23, a raw audio learning signal 12 (FIG. 1) and an effect learning signal 18 (FIG. 1). In one embodiment, the raw audio learning signal 12 is a raw audio signal received from an electric guitar and the effect learning signal 18 is the raw audio learning signal 12 induced with an effect via, for example, an effects pedal.

Upon receipt, the effect-parameterizing logic 53 generates the ANN 16, via a learning algorithm, such as, for example, the NEAT algorithm described hereinabove. In this regard, the effect-parameterizing logic 53 determines the number of processing elements A-E to employ in the ANN 16 so that the ANN 16 induces in the raw audio learning signal 12 the effect contained in the effect learning signal 18. In addition to determining the number of processing elements A-E, the effect-parameterizing logic 53 calculates the strength of the connections 41-48 between the processing elements A-E so that the ANN 16 induces in the raw audio learning signal 12 the effect contained in the effect learning signal 18. The effect-parameterizing logic 53 then stores artificial neural network (ANN) data 40 indicative of the ANN 16 generated.

As indicated hereinabove, the present disclosure describes the effect-parameterizing logic 53 generating a single ANN 16 thereby parameterizing a single effect. However, the effect-parameterizing logic 53 can learn a plurality of effects in the manner described and store ANN data 40 indicative of the ANN 16 for inducing each of the plurality of parameterized effects.

In one embodiment, the output device 15 may comprise a display for displaying a graphical user interface (GUI) (not shown) to a user (not shown). The output device 15 may provide an enumeration of one or more effects that the user can select for inducement in the raw audio signal 13. In such an embodiment, the effect-inducing logic 53 introduces the signal to an ANN stored in the ANN data 40 corresponding to the effect that the user selects.

The effect-inducing logic 54 receives the raw audio signal 13 from the source 11, which is described hereinabove. In this regard, the source 11 may comprise an electric guitar (not shown) or recording equipment (not shown), which is electrically interfaced to the effect-inducing device 14.

Upon receipt of the raw audio signal 13, the effect-inducing logic 54 stores raw signal data 27 indicative of the received raw audio signal 13. Further, the effect-inducing logic 54 introduces the raw audio signal 13 to the ANN 16 generated for the particular effect that the user desires to induce in the raw audio signal 13. The ANN 16 receives the raw audio signal 13 and processes the signal through each of the generated processing elements A-E thereby inducing the effect in the signal 13 generating the induced signal 15.

Once the ANN 16 generates the induced signal 15, the effect-inducing logic 54 stores induced signal data 28 indicative of the induced signal 15. In one embodiment, the effect-inducing logic 54 transmits the induced signal 15 to a signal player 17 (FIG. 1) via the output device 25. The signal player 17 converts the induced signal 15 into audible sound.

Various programs comprising various logic have been described above. Those programs can be stored on any computer-readable medium for use by or in connection with any computer-related system or method. In the context of this document, a computer-readable medium is an electronic, magnetic, optical, or other physical device or means (e.g., memory) that can contain or store computer instructions for use by or in connection with a computer-related system or method.

Figure 5:
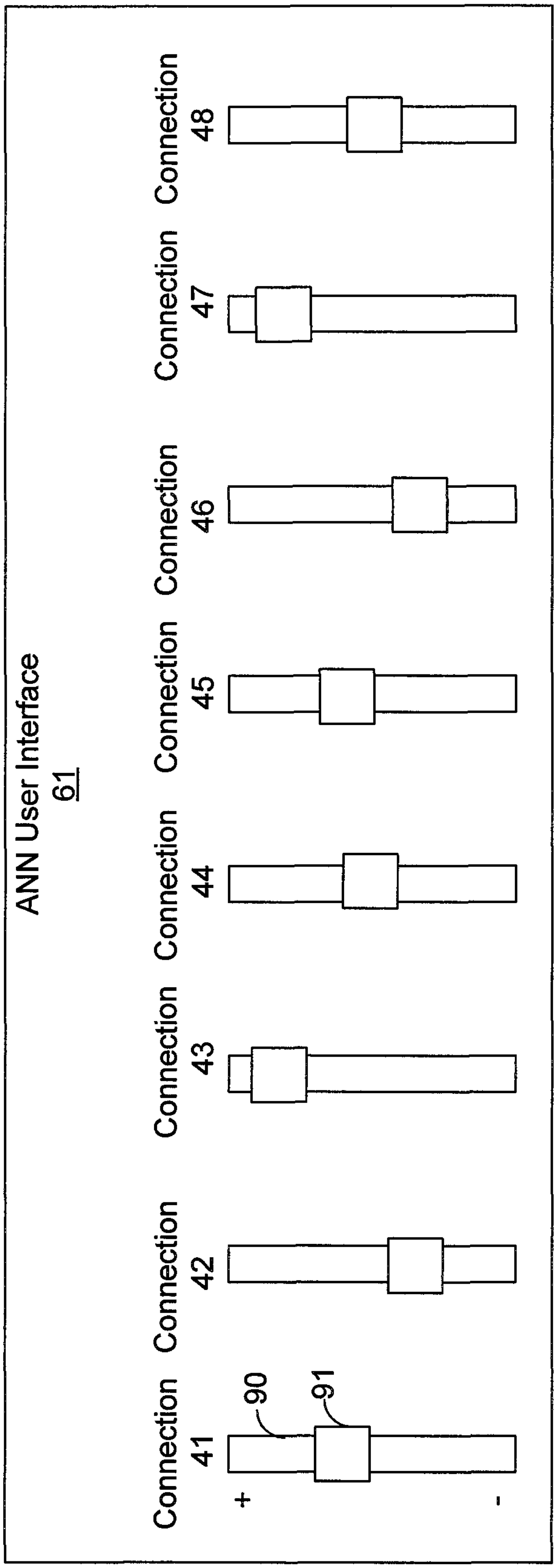
FIG. 5 is an exemplary graphical user interface (GUI) of the effect-inducing device as is depicted in FIG. 1.

In one embodiment, the effect-inducing logic 54 may display to the user a ANN graphical user interface (GUI) 61 as depicted in FIG. 5. Note that the ANN GUI 61 is depicts a GUI associated with the ANN 16 as shown in FIG. 3.

The ANN GUI 61 comprises a plurality of slide bars 90, and each slide bar is associated with a particular connection 41-48, as indicated. Each of the slide bars 90 comprises a sliding tab 91, which can be actuated, for example, by selecting the tab 91 with a cursor (not shown) via the mouse 81. The user (not shown) can move the tab 91 in a positive direction, as indicated by the "+" symbol, or in a negative direction, as indicated by the "−" symbol.

When the tabs 91 are actuated, the connection strengths associated with their respective connections 41-48 are modified, e.g., the strength of the connection is increased or decreased. In such an embodiment, the user modifies the quality or timbre of the effect induced in the induced signal 15 by manipulating the tabs 91, thereby changing the strength of the connections between the processing elements A-E.

Figure 6:
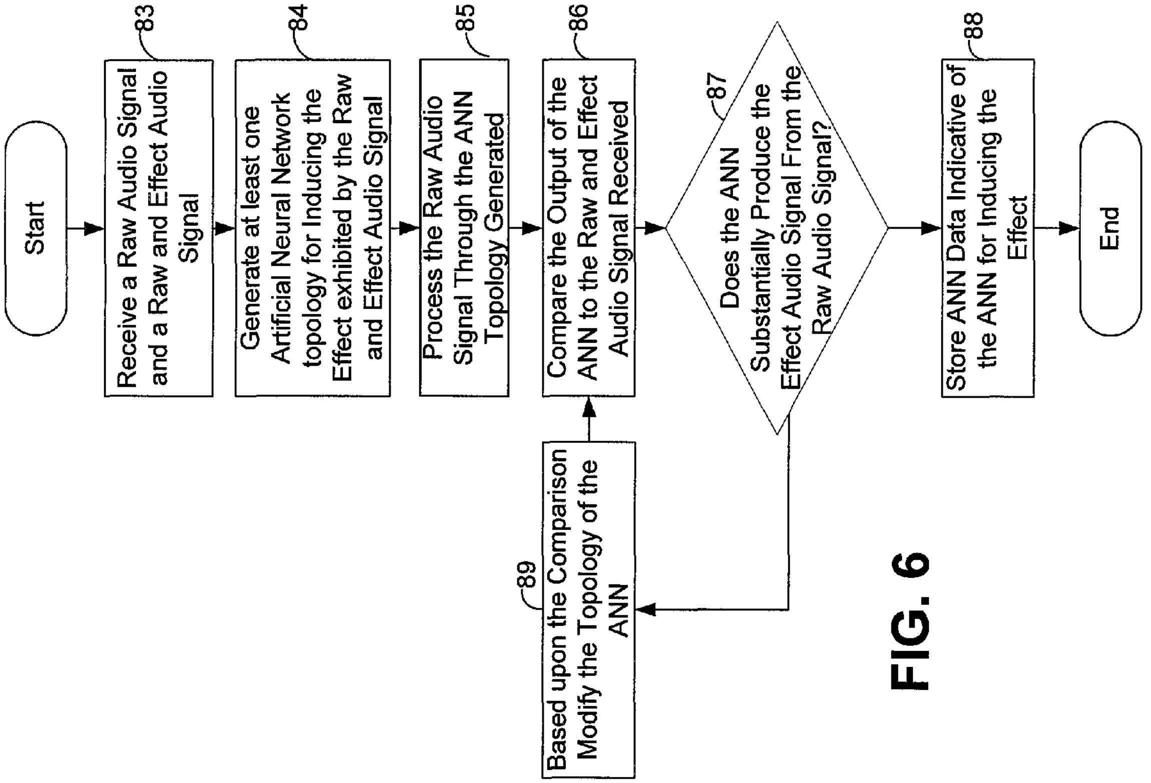
FIG. 6 is a flowchart depicting exemplary architecture and functionality of the effect-inducing device, as is depicted in FIG. 1, for parameterizing an effect.

FIG. 6 is a flowchart depicting exemplary architecture and functionality of the effect-parameterizing logic 53. The effect-parameterizing logic 53 receives the raw audio signal 12 (FIG. 1) and the raw and effect audio signal 18 (FIG. 1) from the source 10 (FIG. 1) as indicated in step 83. As described hereinabove, the raw and effect audio signal 18 comprises the raw audio signal 12 induced with a particular effect.

The effect-parameterizing logic 53 generates at least one ANN topology 19 (FIG. 2) for inducing the particular effect exhibited by the raw and effect audio signal 18 as indicated in step 84. As described hereinabove, one method for generating the ANN 16 is through Neuroevolution of augmenting topologies (NEAT), and generating an initial topology 19 is a step in evolving the ANN 16.

The effect-parameterizing logic 53 processes the raw audio signal 12 through the ANN topology 19 for the ANN 16, as indicated in step 85, and compares the output of the ANN topology 19 for the ANN 16 generated to the raw and effect audio signal 18, as indicated in step 86. If the output of the topology 19 of the ANN 16 compared to the raw and effect audio signal 18 received indicates substantial similarity as indicated in step 87, then the effect-parameterizing logic 53 stores ANN data 40 (FIG. 4) indicative of the ANN 16.

If it does not indicate substantial similarity, then the effect-parameterizing logic 53 modifies the topology 19 of the ANN 16, as indicated in step 89. The effect-parameterizing logic 53 then repeats the comparison step 86 until a topology evolves that produces output signal 32 (FIG. 2) substantially similar to the raw and effect audio signal 18.

Figure 7:
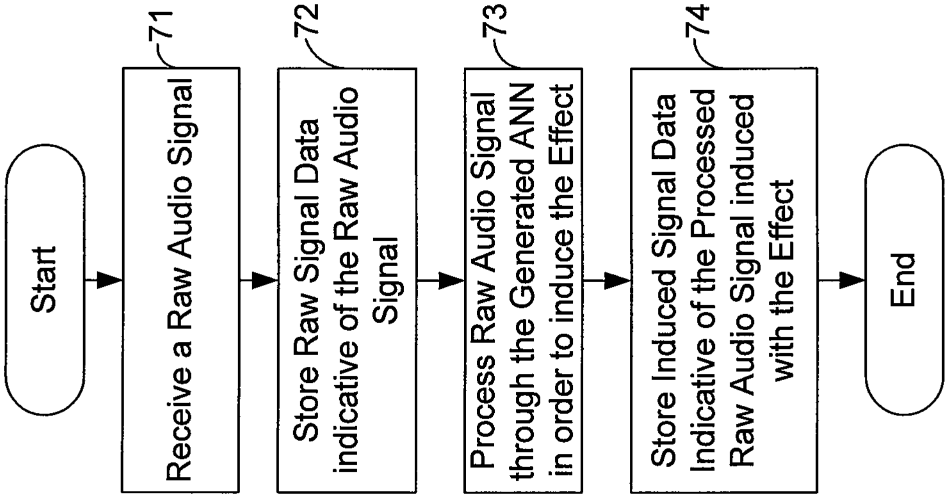
FIG. 7 is a flowchart depicting exemplary architecture and functionality of the effect-inducing device, as is depicted in FIG. 1, for applying an effect to a raw audio signal.

FIG. 7 is a flowchart depicting exemplary architecture and functionality of the effect-inducing logic 54. The effect-inducing logic 54 receives the raw audio signal 13 (FIG. 1) from the source 11 (FIG. 1), as indicated in step 71. As described hereinabove, the raw audio signal 13 may originate from a guitar or it may be a recorded sound file.

The effect-inducing logic 54 stores raw signal data 50 (FIG. 4) indicative of the received raw audio signal 13, as indicated in step 72. The effect-inducing logic 54 processes the raw audio signal 13 through the ANN 16 to produce the effect in the raw audio signal 13, as indicated in step 73. As described hereinabove, a user (not shown) of the effect-inducing system 9 (FIG. 1) may manually select via the input device 23 an ANN 16 for use in processing the raw audio signal 13, and the ANN 16 selected by the user dictates the type of effect that is induced in the signal 13.

Once the raw audio signal 13 is processed by the ANN 16, the effect-inducing logic 54 stores induced signal data 51 indicative of the induced signal 15 generated by as output of the ANN 16, as indicated in step 74. Alternatively or in addition, the effect-inducing logic 54 may transmit the induced signal 15 to a signal player 17 (FIG. 1) that coverts the signal into audible sound.

We claim:

1. An audio processing system comprising:
- a memory having instructions stored thereon; and
- a processor,
- the processor configured by the instructions to:
  - receive a first audio signal from a signal source;
  - receive a second audio signal from the signal source, the second audio signal comprising the first audio signal induced with an effect
  - the processor further configured by the instructions to parameterize the effect of the second audio signal into an artificial neural network (ANN).

2. The audio processing system of claim 1, wherein the processor is further configured by the instructions to receive a raw audio signal from a second signal source and induce the parameterized effect in the raw audio signal via the ANN.

3. The audio processing system of claim 2, wherein the processor is further configured by the instructions to receive a user input indicative of the ANN.

4. The audio processing system of claim 2, wherein the processor is further configured by the instructions to adjust the ANN based upon a user input thereby modifying an audible quality of the raw audio signal induced with the effect.

5. The audio processing system of claim 1, further comprising a signal player, wherein the processor is further configured to transmit an induced signal comprising the raw audio signal induced with the effect to the signal player.

6. The audio processing system of claim 4, wherein the signal player is configured to convert the induced signal to audible sound.

7. The system of claim 1, wherein the processor is further configured by instructions to evolve a topology of the ANN.

8. A method of processing audio, the method comprising:
- parameterizing, in an artificial neural network (ANN) implemented in a computing device, an effect included in a received audio signal;
- storing the ANN in the computing device; and
- inducing the effect in the received audio signal by processing, in the computing device, the signal through the stored ANN.

9. The method of claim 8, further comprising receiving a first audio signal and a second audio signal, the second audio signal comprising the first audio signal and the effect.

10. The method of claim 9, wherein the parameterizing further comprises training the ANN based upon the first audio signal and the second audio signal.

11. The method of claim 8 wherein the parameterizing further comprises employing Neuroevolution through augmenting topologies to generate the ANN.

12. The method of claim 8, wherein the parameterizing further comprises employing a learning algorithm for inducing an effect automatically.

13. The method of 8, further comprising displaying a plurality of indicators indicative of a plurality of ANNs.

14. The method of claim 13, further comprising the of receiving a user selection of one of the plurality of indicators thereby selecting one of the plurality of ANNs for processing the received audio signal.

15. The method of claim 8, wherein the parameterizing further comprises evolving a topology of the ANN.

16. An audio processing system comprising:
- means for parameterizing an effect in an artificial neural network (ANN);
- means for storing the ANN; and
- means for inducing the effect in a raw audio signal via the ANN.

17. A non-transitory computer-readable medium that is encoded with executable instructions that cause a computer to induce an effect in a raw audio signal, the executable instructions comprising:
- logic configured to parameterize an effect in a first audio signal into an artificial neural network (ANN); and
- logic configured to induce the parameterized effect into a second audio signal via the ANN.

18. The computer-readable medium of claim 17, wherein the executable instructions further comprises logic configured to evolve a topology of the ANN.

* * * * *